(12) United States Patent
Furukawa et al.

(10) Patent No.: US 6,333,122 B1
(45) Date of Patent: Dec. 25, 2001

(54) RED-EMITTING MATERIAL AND ORGANIC ELECTROLUMINESCENT DEVICE MADE BY USING THE SAME

(75) Inventors: Kenji Furukawa; Takenori Izumizawa; Manabu Uchida, all of Kanagawa (JP)

(73) Assignee: Chisso Corporation, Osaka (JP)

( * ) Notice: Subject to any disclaimer, the term of this patent is extended or adjusted under 35 U.S.C. 154(b) by 0 days.

(21) Appl. No.: 09/202,999

(22) PCT Filed: Jun. 26, 1997

(86) PCT No.: PCT/JP97/02206

§ 371 Date: Jul. 6, 1999

§ 102(e) Date: Jul. 6, 1999

(87) PCT Pub. No.: WO98/00474

PCT Pub. Date: Jan. 8, 1998

(30) Foreign Application Priority Data

Jun. 28, 1996 (JP) .................................................. 8-188654

(51) Int. Cl.$^7$ .................................................. H05B 33/14
(52) U.S. Cl. .................... 428/690; 428/917; 313/504; 313/506
(58) Field of Search .................................... 428/690, 704, 428/917; 313/504, 506; 252/301.16; 540/145

(56) References Cited

U.S. PATENT DOCUMENTS

| | | | |
|---|---|---|---|
| 4,916,221 | * | 4/1990 | Kumadaki et al. ................. 540/145 |
| 4,950,950 | | 8/1990 | Perry et al. ......................... 313/504 |
| 5,104,637 | * | 4/1992 | Chen et al. ......................... 424/1.1 |
| 5,281,489 | * | 1/1994 | Mori et al. ........................... 428/690 |
| 5,409,783 | * | 4/1995 | Tang et al. .......................... 428/690 |
| 5,554,911 | * | 9/1996 | Nakayama et al. ................ 313/504 |
| 6,048,630 | * | 4/2000 | Burrows et al. ..................... 428/690 |

FOREIGN PATENT DOCUMENTS

| | | |
|---|---|---|
| 2-213088 | 8/1990 | (JP) . |
| 6-158040 | 6/1994 | (JP) . |
| 8-199161 | 8/1996 | (JP) . |

OTHER PUBLICATIONS

Victor S.–Y. Lin et al., "Highly Conjugated Acetylenyl Bridged Porphyrins: New Models for Light–Harvesting Antenna Systems", Science, vol. 264, pp. 1105–1111, May 1994.*

Kampas et al., Chemical Physics Letters, 48 (2), Jun. 1, 1977, pp. 233–236.

Burgess et al., Journal of Luminescence, 28(1983)377–384. (No month).

* cited by examiner

*Primary Examiner*—Marie Yamnitzky
(74) *Attorney, Agent, or Firm*—Wenderoth, Lind & Ponack, L.L.P.

(57) ABSTRACT

A red emitting material consisting of porphyrin, wherein the fluorescence of porphyrin is utilized. Metalloporphyrin can also be used as the porphyrin. An organic electroluminescent element having a porphyrin containing light emitting. The porphyrin content in the light emitting layer may be 1.0% by weight or more. The light emitting layer functions as a hole injection and transport layer or an electron injection and transport layer. Alternatively, it may be possible to further provide a hole injection and transport layer or an electron injection and transport layer.

7 Claims, 1 Drawing Sheet

RED-EMITTING MATERIAL AND ORGANIC ELECTROLUMINESCENT DEVICE MADE BY USING THE SAME

This application is a 371 application of PCT/JP97/02206 filed Jun. 26, 1997.

1. Technical Field

The present invention relates to a red light emitting material and an organic electroluminescence (hereinafter called "organic EL") element. More particularly, the present invention r elates to a red light emitting material using fluorescent light of porphyrin and an organic EL made by using the material.

2. Background Art

An organic EL element has c characteristics of self-luminescence and thin thickness, and the element can be driven with a low voltage. The principle of the organic EL element had already been known in the 60's; at that time, however, the luminescent efficiency was still low so that the emission could only be seen in a dark place.

However, since C. W. Tang et al. published an improved element, which could be seen even in a bright place with a high luminescent efficiency, in the Applied Physics Letter, 51, 913 (1987), the research and development of organic EL has rapidly proceeded.

At the beginning of the development of organic EL, a blue light emitting element was placed emphasis on also several sorts of chemical compound therefor were suggested, because a blue emitting element having a high brightness had not existed at that time. While, many green emitting materials existed, so there was no problem concerning the green emitting material.

On the other hand, nevertheless a red light emitting material is an elemental requirement to realize a full color display; the number of sorts thereof, which have been developed until now, is smaller in comparison to the other colors, so that it is now required rapidly to develop the red light emitting material.

Conventionally, elements are known, for instance, which are disclosed in the Journal of the Applied Physics, 65, 3610 (1989), in Japanese Patent Preliminarily Publication No. Hei6-9953, in the Preliminarily Prepared Paper for the 41th Spring Lecture Meeting of Applied Physics Society, p28-N-1. However, these elements have a low color purity in order to use them as the red component of a multiple color display or a full color display, because the light emission thereof contains a low wave length component. Therefore, these elements are not sufficient for practical use.

By the way, the fact that the porphyrin derivative is useful for an electronic material, particularly, for a hole transporting material can be predicted from the property of phthalocyanine, which is called as "azaporphyrin" and has a similar construction to that of porphyrin. The electric characteristic of phthalocyanine has been well studied; many trials for an organic functional material have been taken for phthalocyanine.

Further, it is also well known that phthalocyanine is useful as a hole transporting layer of the organic EL element, from which it can be guessed that porphyrin could be used as a hole transporting layer of the organic EL element.

However, the conventionally known usage of porphyrin as an organic electronic material is limited to the hole transporting function. For instance, an application of porphyrin for a hole transporting material is mentioned in Japanese Patent Publication No. Hei01-7635, Japanese Patent Preliminarily Publication Nos. Sho63-295695, Hei-04-233194, Hei04-233195, Hei05-17765 and Hei06-215874, an application for an electrochromic material is disclosed in Japanese Patent Publication Nos. Hei01-33808 and Hei01-33809; an application for an optical memory or an optical conductive material is recited in Japanese Patent Preliminarily Publication No. Hei07-278445. All of these techniques use the hole transporting function of porphyrin; there is no study however as to the use of porphyrin as a light emitting material using its fluorescent characteristic.

In this manner, the usage of porphyrin for an organic electronic material has been widely known, but the application of porphrin for a light emitting element using its fluorescent characteristic has never been considered, much less it has not been known at all that porphyrin functions as a material for the organic EL element to realize a red light emission with a high purity.

DISCLOSURE OF INVENTION

The present invention has been made to solve the task of the prior art mentioned above and has its purpose to provide a red light emitting material which realizes a red light emission with a high purity and to provide an organic EL element using the material.

The present inventors studied several sorts of material to realize a red emitting organic element having a high purity; then they paid attention to a characteristic in that the porphyrin derivative has a strong absorption called a "soret band" in the vicinity of 400 nm and shows a fluorescence in the vicinity of 600 nm. As a request of studying to use the fluorescent characteristic of porphyrin, which had not been considered at all at that time, the inventors found that a red light emitting EL element with a high purity can be produced by the porphyrin and completed the present invention.

That is to say, the red light emitting material according to the present invention has a characteristic in that the material is for use in an organic electroluminescent element and consists of porphyrin.

Further, the organic electroluminescent element according to the invention comprises a light emitting layer which contains porphyrin.

Furthermore, the other organic electroluminescent element according to the invention comprises a hole transporting material, an electron transporting material and a layer which contains porphyrin of 1.0% by weight or above.

The detail of the present invention will be explained below.

It should be noted that the "porphyrin" used in the present invention is a generic term for a chemical compound having its basic structure of porphyrin where four pyrrole rings are combined by a methine group and it is obtained by substitution of hydrogen atoms existing around the basic structure.

Sometimes such a definition is used that phthalocyanine is a sort of porphyrin, however, phthalocyanine is excluded from the present invention. Since phthalocyanine, which is possessed in porphyrin, does not have the intended fluorescent characteristic, therefore it cannot be preferably used.

The porphyrin according to the invention can be expressed, for instance, by the following generic formula (1):

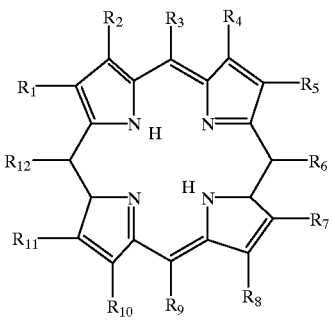

...(1)

(wherein, R1 to R12 in the formula represent, independently, hydrogen, halogen, substituted or non-substituted alkyl group, alkoxy group, aryloxy group, perfluoroalkyl group, perfluoroalkoxy group, amino group, alkylcarbonyl group, arylcarbonyl group, alkoxycarbonyl group, aryloxycarbonyl group, azo group, alkylcarbonyloxy group, arylcarbonyloxy group, alkoxycarbonyloxy group, aryloxycarbonyloxy group, sulfinyl group, sulfonyl group, silyl group, carbamoyl group, aryl group, heterocyclic group, alkenyl group, alkynyl group, nitro group, formyl group, nitroso group, formyloxy group, isocyano group, cyanate group, isocyanate group, thiocyanate group, isothiocyanate group, cyano group, or condensate of substituted or non-substituted cycles in case of adjacent substituent groups thereof.

Further, the porphyrin for use in a light emitting material of organic EL element, particularly, a red light emitting material of organic EL element in the present invention, is not limited to the porphyrin expressed by the above-mentioned generic, formula (1) but may be provided with natural porphyrin, a high polymer molecule derived from the above-mentioned porphyrin, or a metalloporphyrin that is a metal complex of these porphyrins.

More concretely, ethioporphyrin-I, deuteroporphyrin-IX, meso-porphyrin-IX, hematoporphyrin-IX, protoporphyrin-IX, coproporphyrin-I, coproporphyrin-III, uroporphyrin-I, uroporphyrin-III, chlorofluoroporphyrin, hematoporphyrin, deuteroporphyrin-IX 2,4-di-acrylic acid, 2,4-diformyldeuteroporphyrin-IX, 2,4-diacetyldeuteroporphyrin-IX, deuteroporphyrin-IX 2,4-disulfonic acid, phylloporphyrin-XV, pyroporphyrin-XV, rhodoporphyrin-XV, phylloerythrin, phaeoporphyrin-a5, tetoraphenylporphyrin, protoheme, etc. can be cited.

Furthermore, as the metal to be introduced into metalloporphyrin, Mg, Al, S, Ca, Sc, Ti, V, Cr, Mn, Fe, Co, Ni, Cu, Zn, Ga, Ge, As, Sr, Y, Zr, Nb, Mo, Rh, Pd, Ag, Cd, In, Sn, Sb, Ba, Hf, Ta, W, Re, Os, Ir, Pt, Au, Hg, Tl, Pb, Bi, Pr, Yb, Th, etc. should be mentioned.

The light emitting layer consisting of porphyrin or the light emitting layer obtained by mixing porphyrin with an organic carrier transporting material can be formed by using a known method, such as a deposition, a spin coating, and a casting; thereby an element which realizes a red light emission by applying a voltage can be obtained with a high color purity.

The gist of the construction of the organic EL element will be explained below.

An organic EL element produces exciton by the recombination of holes injected through a positive electrode and electrons injected through a negative electrode; the light generated when the exciton disappears is used. Therefore, in principle, the element has to have a hole injection and transport material, and an electron injection and transport material, and a light emitting material. However, some materials combine these functions, so that the above-mentioned materials can be omitted as the occasion may demand.

There are several ways for the construction of organic EL element. Basically, the construction may be provided by a pair of electrodes (anode and cathode) and a light emitting layer held by the electrodes. It may be possible to add a hole injection and transport layer and/or an electron injection transport layer as occasion demands. The hole injection and transport layer or the electron injection and transport layer sometimes functions as a light emitting layer.

Furthermore, in order to improve the luminescent efficiency, it may provide a hole interrupting layer or an electron interrupting layer.

According to the organic EL element of the present invention, porphyrin is contained in the light emitting layer; however, in case that the EL element comprises the hole injection and transport layer and/or the electron injection and transport layer, porphyrin may be contained in these layers. In this case, the porphyrin contained into these layers functions as an assistant for the red light emission.

Moreover, according to the invention, it is also possible to provide a mixture layer (which works as a light emitting layer) where a hole transporting material, an electron transporting material and porphyrin are mixed together.

In this case, it is preferred that the content of porphyrin in these layers is 1% by weight. Further, in case that the organic EL element according to the invention is used independently, it is preferred to make the content of porphyrin 3% by weight or above, in order to make a visual sense of red color. Furthermore, in order to use the element as a full color display element or a multiple color display element where a color tone is attached importance, the content of porphyrin may be preferably 5% by weight or above, because a higher red color purity is required in such a case.

According to the organic EL element of the present invention, it is possible to adjust the red color purity without affecting the luminescent efficiency by changing the content of porphyrin . For instance, when the content of porphyrin is 40% by weight or above, the luminescent efficiency does not decrease so much, and a display element having an extremely high color purity can be obtained.

The conventional color producing assistant reagent is used in such a manner that a small amount of the assistant reagent is doped into a light emitting layer. Contrary to this, according to the EL element of the present invention, a large amount of porphyrin can be doped in the light emitting layer, etc. greatly exceeding over the conventional range of the dopant. Particularly, in such a case, it is presumed that the porphyrin serves other functions than that of the assistant reagent.

There is an example of a method for the EL element according to the invention that a thin film is formed between electrodes directly or via a carrier transporting layer, which can be obtained by deposition of porphyrin compound, or spin coating or dipping with a material which is obtained by dissolving the porphyrin compound in a solvent medium or by dissolving the porphyrin compound in a solvent medium using a high polymer molecule as an integrating agent.

The other method for forming the EL element can also be cited where the porphyrin compound is mixed into a known carrier transporting material.

It should be noted that porphyrin is an amphoteric compound; thus the layer obtained in the above-mentioned way can hold all layers of the hole injection and transport layer, the electron injection and transport layer and the light emitting layer.

In such a construction of the element, it is preferred that at least one of the electrodes is supported by a base plate. There is no special limitation for the base plate, so that conventional materials for the base plate of the organic EL element, such as glass, plastic, quartz and ceramics, can be used.

As an anode of the organic EL element, an electrode having an electrode substance made of a metal, an alloy, an electric conductive compound and a mixture thereof, each having a large work function (4 eV or more), can be preferably used. For instance, a metal such as Au, electric conductive transparent material, such as CuI, $SnO_2$, ZnO and ITO (Indium oxide) can be cited as such an electrode substance.

The anode can be obtained by forming a thin film by treating the electrode substance by deposition, spattering, or other conventional methods.

On the other hand, as a cathode of the organic EL element, and electrode provided with an electrode substance made of a metal, an alloy, an electric conductive compound and a mixture thereof, each having a small work function (4.3 eV or less), can be preferably used. For instance, Na, Na-K alloy, Al, Mg, Li, Li alloy, Mg alloy, Al alloy, Mg/Ag alloy, In, etc. can be mentioned for the electrode substance of cathode.

The cathode can be obtained by forming a thin film treated with these electrode substance by deposition or spattering, etc.

Next, the hole transporting material for use in forming the hole injection and transport layer is a chemical compound by which holes can appropriately be transported to the light emitting layer when holes are injected from the anode. The hole transporting material is not specially limited so far as the material has the above desired characteristic; so that the material used as a carrier transporting material for hole out of photoconductive materials, or a material selected from known materials used for the hole transporting layer of an organic EL element can be used.

The electron transporting material for use in forming the electron injection and transport layer also is not specially limited so far as the material has a function that transports the electrons injected from a cathode into the light emitting material; so that an arbitrary material selected from known chemical compounds which have been conventionally used as organic EL material can be used.

Then, as an example of preferred methods for manufacturing an organic EL element according to the present invention will be explained.

First, the method for manufacturing an EL element comprising anode/porphyrin compound/cathode will be explained. An anode is formed in such a manner that a thin film having its thickness of 1 μm or less, preferably 10 to 200 nm, made of a desired electrode material, for instance a substance for anode is formed on an appropriate base plate with the aid of deposition or spattering, etc.; then a thin film made of porphyrin is formed on the anode to provide a light emitting layer.

In this case, the light emitting layer may be formed only of porphyrin or of mixture of a luminescent mother material of carrier transporting material, such as hole transporting material or electron transporting material, and porphyrin. It should be noted that in order to obtain a preferred red color purity and a high luminescent efficiency, it is desired to mix the porphyrin with other material.

As methods for forming a thin film of a light emitting material for such a layer, for instance, a dipping method, a spin coating method, a deposition, etc can be used: any method can be used to form the porphyrin thin layer.

After forming the luminescent layer, i.e. a porphyrin layer or a layer containing porphyrin, another thin layer made of a substance for cathode is formed thereon by deposition or spattering to have a cathode layer, so that a desired organic EL element can be obtained.

It should be noted that the above-mentioned order to manufacture the organic EL element can be reversed; that is to say, it is possible to manufacture the element in the order from the cathode, the light emitting layer, and the anode.

Then, the method for manufacturing an organic EL element comprising an anode/hole injection transporting·luminescent layer made of porphyrin or containing porphyrin/electron injection and transport layer/cathode will be explained.

The anode and the porphyrin layer, etc. are formed in the same manner as the above-mentioned method for manufacturing the organic EL element; the electrron transporting layer is formed by deposition etc., as well as the above case; then cathode is formed.

The layer containing porphyrin can be formed in such a manner that an appropriate amount of porphyrin and a material having a hole transporting function or high polymer molecular integrating agent are dissolved in a solvent, and then spin coating or dipping the thus obtained material. Or, the thin film may be provided by flash deposition or co-deposition from a plurality of deposition sources.

As well as the above case, it is possible to manufacture the element in a reversed order.

In addition, the elements having other constructions, such as anode/hole transporting layer/light emitting layer containing porphyrin/electron transporting layer/cathode, and anode/hole transporting layer/electron injection transporting·light emitting layer containing porphyrin/cathode, can be manufactured in the same manner as the above.

It should be noted that porphyrin can also be used for a red color light emitting material of the organic EL element obtained by a color exchange method, which is mentioned in the Japanese Patent Preliminarily Publication Nos. Hei5-2558860 and Hei6-203963.

When a direct or an alternating voltage (about 2 to 40V) is applied on the thus obtained EL element, a light emission can be observed from the transparent or semi-transparent electrode side.

For practical use, a luminescent intensity more than 10 $cd/m^2$ is necessary: the EL element according to the present invention can be achieved at this level.

BEST MODE FOR CARRYING OUT THE INVENTION

Figure 1:
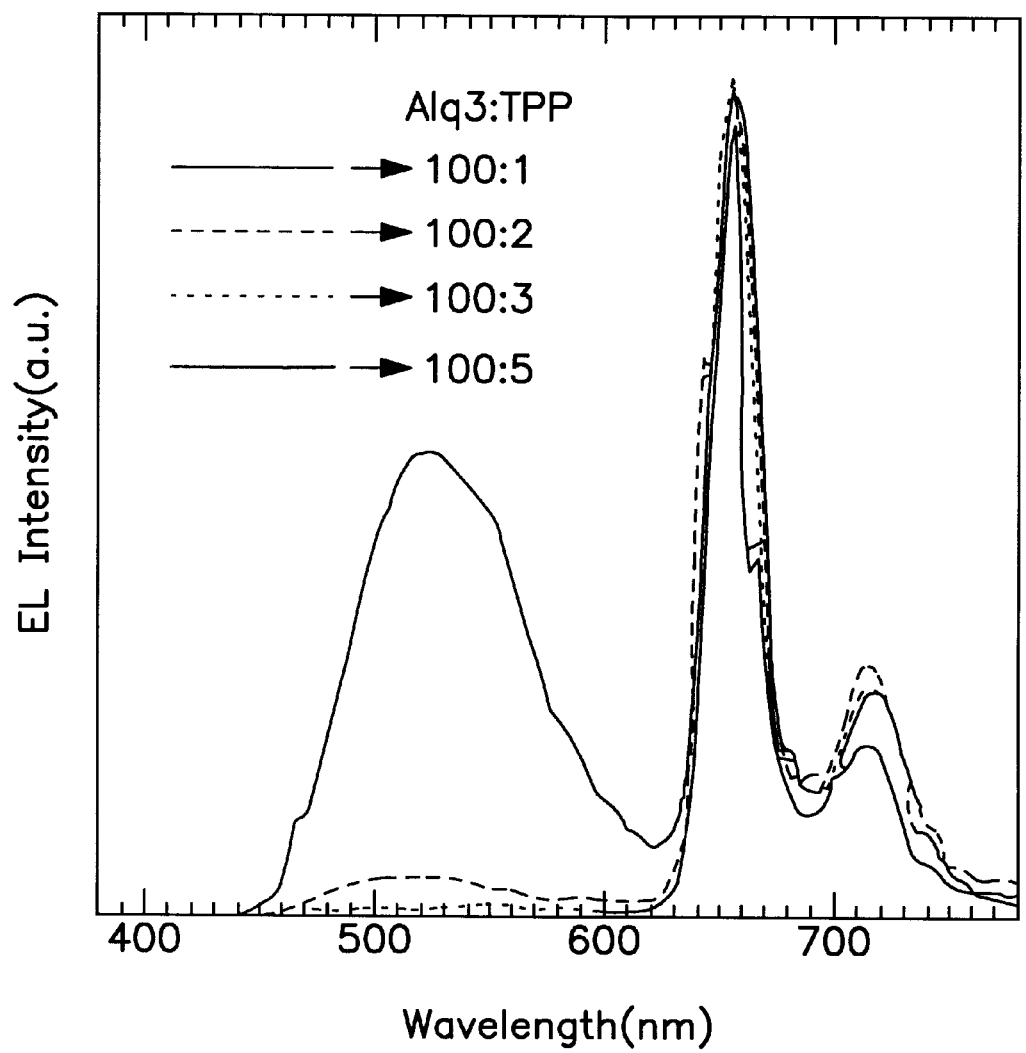
FIG. 1 is a graph showing an EL spectrum in an example of the organic EL element according to the invention.

The present invention will be explained in more detail on the basis of embodiments; however, the invention is not limited to the embodiments.

Embodiment 1

A glass plate having a desired patterning shape with an ITO electrode is fixed on a base plate holder of a deposition apparatus, which is available from a market; N, N'-diphenylene-N, N'-bis-(3-methylphenyl)-4, 4'-diamine (TPD) is deposited on the fixed base plate from a crucible made of quartz at a degree of vacuum of $8 \times 10^{-4}$ Pa and a deposition speed of 0.1 to 0.2 nm/sec to obtain a hole injection and transport layer having a thickness of the film of 50 nm formed across the ITO electrode and the glass base plate.

Then, 5,10,15,20-Tetraphenyl-21H,23H-porphine (TPP; tetraphenylporphyrin) is deposited from a crucible made of quartz at a degree of vacuum of $8 \times 10^{-4}$ Pa and a deposition speed of 0.1 to 0.2 nm/sec to obtain a layer having a thickness of the film of 50 nm, which works as an electron injection and transport layer and a light emitting layer. Then, magnesium and silver are co-deposited on the layer, which works as an electron injection and transport layer and a light emitting layer, via a shadow mask at a degree of vacuum of $1 \times 10^{-3}$ Pa, and at a deposition speed of 1 to 1.2 nm/sec. and using a crucible made of graphite for magnesium, while at a deposition speed of 0.08 to 0.11 nm/sec and using a crucible made of graphite for silver to provide a magnesium/silver electrode having a film thickness of 150 nm.

When a direct voltage was applied to the EL element with the ITO electrode as an anode and the magnesium/silver electrode as a cathode, a red light emission with chromaticity coordinates of X=0.73, Y=0.27 was obtained. The brightness thereof was 60 cd m$^2$ when the applied voltage was 10V.

Embodiment 2

A hole injection and transport layer is formed on a glass base plate with ITO electrode by repeating the operation mentioned above; TPP and Tris (8-hydroxyquinolinato) Aluminum (Alq$_3$) are co-deposited at a degree of vacuum of $8 \times 10^{-4}$ Pa; at a deposition speed of 0.02 to 0.04 nm/sec and using a crucible made of quartz for TPP, while at a deposition speed 0.1 to 0.2 nm/sec and using a crucible made of quartz for the Tris (8-hydroxyquinolinato) Aluminum (Alq$_3$) to obtain a light emitting layer having a film thickness of 50 nm.

Then, a magnesium/silver electrode is formed on the light emitting layer in the same manner of the embodiment 1. When a direct voltage is applied to the thus obtained EL element as well as the embodiment 1, a red color light emission with a chromaticity coordinates of X=0.73, Y=0.27 was obtained. The brightness thereof was 40 cd m$^2$ when the applied voltage was 6V.

Embodiment 3

An organic EL element was manufactured by repeating the same operation of the embodiment 2 but a zinc substituent TPP was used instead of TPP. When a direct voltage was applied to this EL element in the same manner as the embodiment 1, a reddish orange color light emission with chromaticity coordinates of X=0.67, Y=0.33 was obtained. The brightness thereof was 50 cd m$^2$ when the applied voltage was 10V.

Embodiment 4

A hole injection and transport layer and a light emitting layer were subsequently formed on a glass base plate with ITO electrode by repeating the same operation as that of the embodiment 2. Then, 1, 1-dimethyl-2, 5-di(2-pyridil)-3, 4-diphenylsilacyclopentadiene is deposited from a crucible made of quarts at a degree of vacuum of $8 \times 10^{-4}$ Pa and at a deposition speed of 0.1 to 0.2 nm/sec. to form an electron injection and transport layer having a film thickness of 50 nm on the light emitting layer.

Then, a magnesium/silver electrode was formed on the electron injection and transport layer in the same manner as in the embodiment 1. When a direct current was applied to the thus obtained EL element in the same manner as the embodiment 1, a red color light emission with a chromaticity coordinates of X=0.73, Y=0.27 was obtained. The brightness thereof was 50 cd m$^2$ when the applied voltage was 9V.

Embodiment 5

A thin film having a thickness of 100 nm made of a material obtained by spin coating a liquid obtained by dissolving 1 weight part of polyvinylcarbazole, 1 weight part of 2,5-bis (1-naphthyl)-1,3,4-oxadiazol and 0.4 part per weight of TPP in 1,2-dichloroethane was formed as an light emitting layer on a glass base plate with an ITO electrode, which is shown in the embodiment 1, and the thus obtained film was fixed to a base plate holder of the deposition apparatus.

Then a magnesium/silver electrode was formed on the light emitting layer in the same manner as in the embodiment 1. When a direct voltage was applied to the thus obtained EL element, a red light emission could be obtained.

Embodiment 6

A light emitting layer was formed by repeating the same operation as in the embodiment 5, then the supporting plate was fixed on a base plate holder of the deposition apparatus. Then, a layer made of Alq$_3$ was formed on the light emitting layer as an electron injection layer by deposition from a crucible made of quartz at a degree of vacuum $8 \times 10^{-4}$ Pa and a deposition speed of 0.1 to 0.2 nm/sec. to obtain an electron injection and transport layer having a thickness of 20 nm.

Thereafter, a magnesium/silver electrode was formed in the same manner as the embodiment 1. When a direct voltage was applied to the thus obtained EL element, a red light emission could be obtained.

Embodiment 7

After forming a hole transporting layer by repeating the same operation of the embodiment 1, tetraphenylporphyrin and Tris (8-hydroxyquinolinato) Aluminum were co-deposited at a degree of vacuum of $8 \times 10^{-4}$ Pa; at a deposition speed of 0.03 to 0.04 nm/sec and using a crucible made of quartz for the tetraphenylporphyrin, while at a deposition speed of 1.0 to 1.3 nm/sec. and using a crucible made of quartz for Tris (8-hydroxyquinolinato) Aluminum to obtain a light emitting layer having a thickness of 50 nm. Then, a magnesium/silver electrode is formed on the luminescent layer in the same manner of the embodiment 1. When a direct voltage is applied to the thus obtained EL element as well as the embodiment 1, a red color light emission with a chromaticity coordinates of X=0.67, Y=0.31 was obtained. The brightness thereof was 40 cd m$^2$ when the applied voltage was 20V.

Embodiment 8

After forming a hole transporting layer by repeating the same operation of the embodiment 1, tetraphenylporphyrin and Tris (8-hydroxyquinolinato) Aluminum were co-deposited at a degree of vacuum of $8 \times 10^{-4}$ Pa; at a deposition speed of 0.2 to 0.3 nm/sec and using a crucible made of quartz for the tetraphenylporphyrin, while at a deposition speed of 0.2 to 0.3 nm/sec. and using a crucible made of quartz for Tris (8-hydroxyquinolinato) Aluminum to obtain a light emitting layer having a thickness of 50 nm. Then, a magnesium/silver electrode is formed on the light emitting layer in the same manner of the embodiment 1. When a direct voltage is applied to the thus obtained EL element as well as the embodiment 1, a red color light emission with a chromaticity coordinates of X=0.73, Y=0.27 was obtained. The brightness thereof was 200 cd m$^2$ when the applied voltage was 12V.

EL spectrums for each EL element obtained in these embodiments is shown in FIG. 1.

Industrial Applicability

As explained above, according to the invention, a red light emitting material realizing a red color light emission with a high color purity and an organic EL element using the material can be provided by using a fluorescent characteristic of porphyrin.

That is to say, the organic el element according to the invention can emit a red color light with a high color purity; therefore, a display element having a high color reproducibility can be obtained by using the organic el element according to the invention as a red color emitting source for a full color plane light emitting element or a luminescent element for displays.

What is claimed is:

1. An organic electroluminescent element comprising a red color light emitting layer which contains porphyrin (excluding phthalocyanine and octaethylporphyrin).

2. An organic electroluminescent element according to claim 1, wherein said light emitting layer functions as a hole injection transporting layer or an electron injection and transport layer.

3. An organic electroluminescent element according to claim 1, wherein said light emitting layer contains porphyrin of 1.0% by weight or above.

4. An organic electroluminescent element according to claim 2, wherein said light emitting layer contains porphyrin of 1.0% by weight or above.

5. An organic electroluminescent element according to any one of claims 1 to 3, or 4, wherein a hole injection and transport layer and/or an electron injection and transport layer is further provided.

6. An organic electroluminescent element according to claim 5, wherein said hole injection and transport layer and/or electron injection and transport layer contains porphyrin.

7. An organic electroluminescent element according to claim 6, wherein said hole injection and transport layer and/or electron injection and transport layer contains porphyrin of 1.0% by weight or above.

* * * * *